United States Patent [19]
Nowak et al.

[11] Patent Number: 5,883,566
[45] Date of Patent: Mar. 16, 1999

[54] NOISE-ISOLATED BURIED RESISTOR

[75] Inventors: Edward J. Nowak; Xiaowei Tian; Minh H. Tong, all of Essex, Vt.

[73] Assignee: International Business Machines Corporation, Armonk, N.Y.

[21] Appl. No.: 804,601

[22] Filed: Feb. 24, 1997

[51] Int. Cl.$^6$ ...................................................... H01C 1/02
[52] U.S. Cl. .............................................. 338/311; 357/51
[58] Field of Search ..................................... 338/308, 309, 338/64, 226, 307; 357/51

[56] References Cited

U.S. PATENT DOCUMENTS

| | | | |
|---|---|---|---|
| 3,386,865 | 6/1968 | Doo et al. | 148/75 |
| 3,534,234 | 10/1970 | Clevenger et al. | 315/235 |
| 3,966,577 | 6/1976 | Hochberg et al. | 204/192 |
| 3,970,486 | 7/1976 | Kooi et al. | 148/187 |
| 4,212,083 | 7/1980 | Rao | 365/154 |
| 4,228,450 | 10/1980 | Anantha et al. | 357/51 |
| 4,316,319 | 2/1982 | Anatha et al. | 29/577 |
| 4,418,469 | 12/1983 | Fujita | 29/577 |
| 4,672,584 | 6/1987 | Tsuji et al. | 365/226 |
| 4,725,810 | 2/1988 | Foroni et al. | 338/226 |
| 4,786,880 | 11/1988 | Voorman | 330/294 |
| 4,868,537 | 9/1989 | Blanchard et al. | 338/308 |
| 5,073,508 | 12/1991 | Villalon | 338/226 |
| 5,200,733 | 4/1993 | Davis et al. | 338/64 |
| 5,352,994 | 10/1994 | Black et al. | 333/33 |
| 5,440,162 | 8/1995 | Worley et al. | 257/355 |
| 5,506,528 | 4/1996 | Cao et al. | 327/108 |
| 5,729,043 | 3/1998 | Shepard et al. | 257/519 |

*Primary Examiner*—Teresa Walberg
*Assistant Examiner*—Jeffrey Pwu
*Attorney, Agent, or Firm*—Whitham, Curtis & Whitham; Eugene I. Shkurko

[57] ABSTRACT

A noise-isolated buried resistor satisfies the requirements for low-noise analog designs requiring well controlled ohmic resistors. A field shield is provided between the buried resistor and the substrate to isolate the buried resistor from the substrate noise. This is accomplished by using the standard buried resistor layout and mask sequence with two exceptions. First, the buried resistor is placed in an N-well region, rather than simply a P-well region. Second, a boron implant is added through the buried resistor mask to provide a P-well inside the N-well to isolate the buried resistor electrically from the N-well. The N-well may then be electrically connected to a "quiet" ground. The P-well inside of the N-well may be left floating.

33 Claims, 5 Drawing Sheets

NOISE-ISOLATED BURIED RESISTOR

BACKGROUND OF THE INVENTION

1. Field of the Invention

The present invention generally relates to electrical resistors fabricated in very large scale integrated (VLSI) analog circuits and, more particularly, to a low-noise ohmic buried resistor fabricated using complementary metal oxide semiconductor (CMOS) technology.

2. Background Description

The buried resistor is a standard element in complementary metal oxide semiconductor (CMOS) technologies. It consists, for example, of an N+ doped region in a P-type substrate (or P-well) and, as such, is strongly coupled to any noise present in the substrate. This prohibits use of the resistor in applications requiring low noise elements, such as analog circuits.

Another type of resistor used in certain types of integrated circuit (IC) technologies is a polysilicon on thick oxide structure that provides lower capacitance to the substrate and thus better noise immunity. These resistors can also be built over an N-well in order to use the N-well as a field shield to further reduce noise coupling to the substrate. However, this type of resistor is not generally compatible with certain CMOS technologies. Furthermore, the buried resistor has much greater heat dissipation capability and is less expensive to manufacture, thus generally more desirable for many applications apart from its poor noise isolation characteristics.

SUMMARY OF THE INVENTION

It is therefore an object of the present invention to provide a noise-isolated buried resistor that satisfies the requirements for low-noise analog designs requiring well controlled ohmic resistors.

According to the invention, there is provided a field shield between the buried resistor and the substrate to isolate the buried resistor from the substrate noise. This is accomplished by using the standard buried resistor layout and mask sequence with two exceptions. First, the buried resistor is placed in an N-well region, rather than simply in a P-well region. Second, a boron implant is added through the buried resistor mask to provide a P-well inside the N-well to isolate the buried resistor electrically from the N-well. The N-well may then be electrically connected to a "quiet" ground. The P-well inside of the N-well may be left floating.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
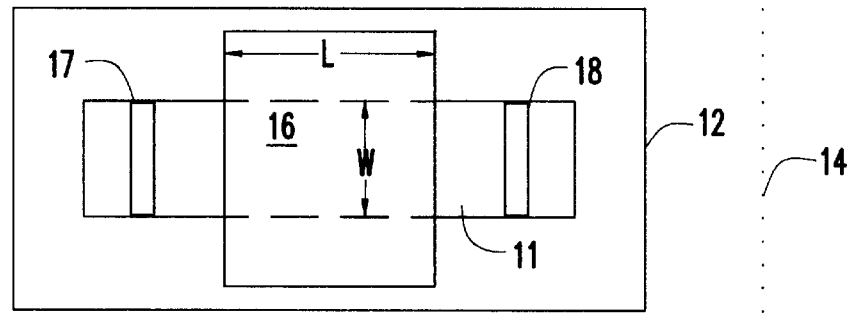
FIG. 1 is a plan view showing the layout of the noise isolated buried resistor according to the invention.
Figure 2:
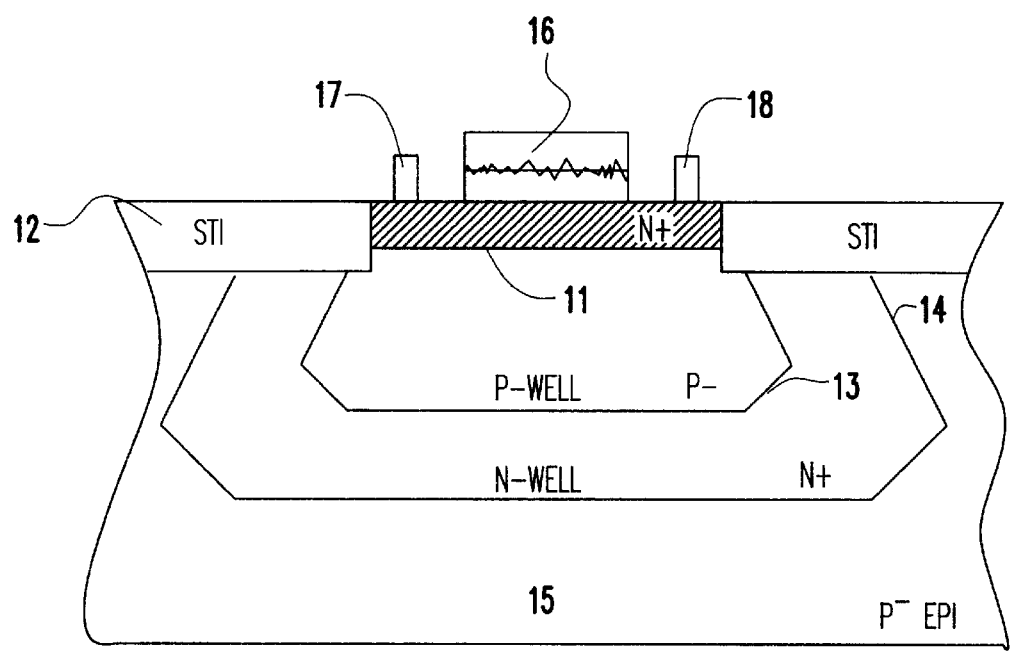
FIG. 2 is a cross-sectional view of the noise isolated buried resistor according to the invention.

Referring now to the drawings, and more particularly to FIGS. 1 and 2, there is shown in plan view and cross-sectional view, respectively, the buried resistor structure according to the invention. The area identified as 11 is an opening in a layer 12 of silicon dioxide ($SiO_2$). The $SiO_2$ serves as a shallow trench isolation (STI) for the resistor. The area identified as 13 denotes the area of a P-well as a so-called 'first well region' for purposes of this invention. The area identified as 14 denotes the area an N-well as a so-called 'second well region' for purposes of this invention. As seen particularly in FIG. 2, the N-well is formed in a P-type epitaxial layer 15 on the substrate, for example with a boron implant, and the P-well 13 is formed within the N-well 14. The buried resistor is formed as an N+ implant in the area 11 with a polysilicon layer 16 overlying the N+ implant. The dimensions of the resistor are defined by the area 11 and the polysilicon layer 16. Specifically, as shown in FIG. 1, the length L of the resistor is the width of the polysilicon layer 16, and the width W of the resistor is the width of the area 11 defined by the opening in STI layer 12. The contacts 17 and 18 provide the input and output of the resistor.

The N-well 14 is a field shield that provides the noise isolation for the buried resistor according to the invention. In order to better understand the problem with the conventional buried resistor and why the invention provides noise isolation, the steps of manufacture of a conventional buried resistor will first be described.

Figure 3:
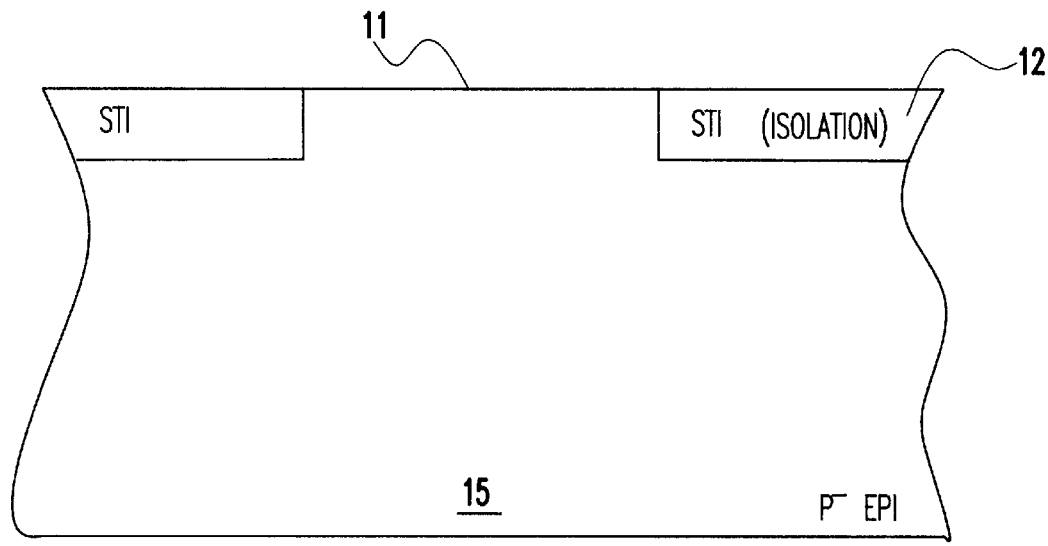
FIG. 3 is a cross-sectional view of the first step in the manufacture of a buried resistor.
Figure 4:
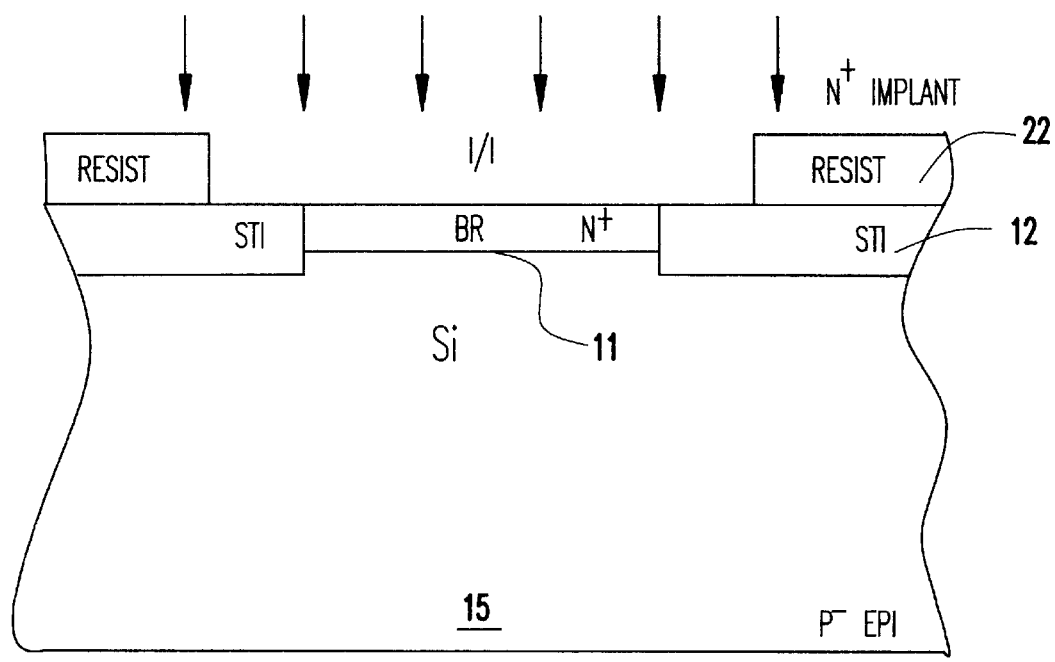
FIG. 4 is a cross-sectional view of the second step in the manufacture of a buried resistor.
Figure 5:
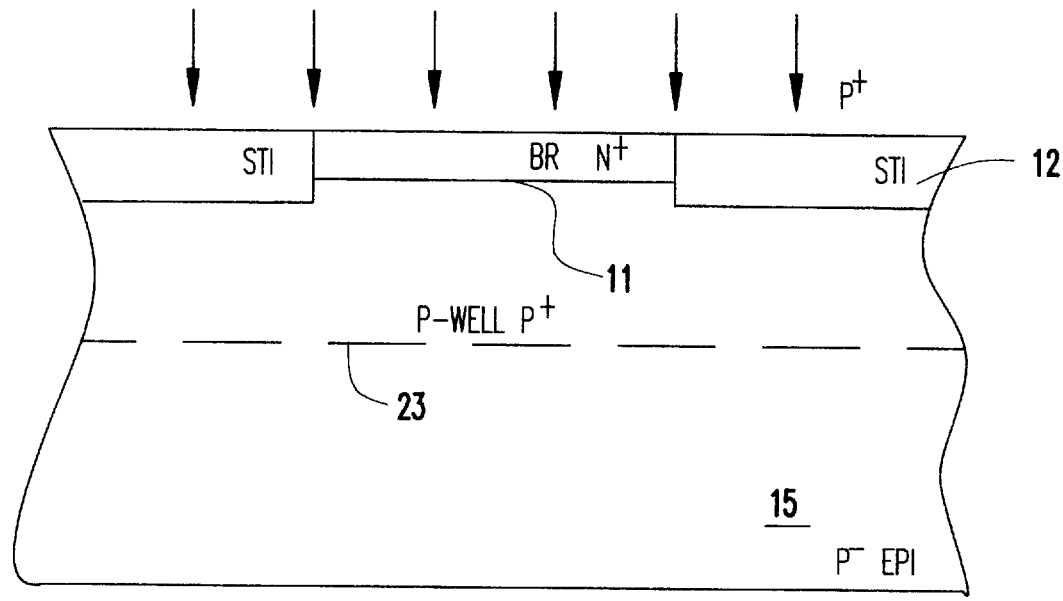
FIG. 5 is a cross-sectional view of the third step in the manufacture of a buried resistor.

In FIG. 3, the shallow trench isolation (STI) 12 defines an opening corresponding to the area 11 in a P-type epitaxial layer 15. In FIG. 4, a resist 22 is patterned on the STI 12. The opening in the resist 22 corresponds to the area 13 and serves as the mask for the N+ implant 23 forming the buried resistor. Note that while some of the implant will fall on exposed areas of the STI 12, it has no effect on the final structure of the resistor since the STI is an oxide. In FIG. 5, the resist is stripped, and a P-well implant is made to form the P-well 23 in the P-type epitaxial layer 15. Then in FIG. 6, a polysilicon layer 16 is formed over the N+ implant region 11. A silicide 24 is formed over the polysilicon layer 16 and silicon layer 11. The silicide has much lower sheet resistance than doped silicon (i.e., layer 11). It can be formed by depositing metal such as titanium (Ti) or Cobalt (Co) on silicon and then sintering. Finally, in FIG. 7, the contacts 17 and 18 for the buried resistor are formed. These contacts may be part of a metallic layer. As can be seen in the resulting structure of FIG. 7, if there is noise in the substrate, i.e., the P-well, the buried N+ resistor will be coupled to the noise.

Figure 6:
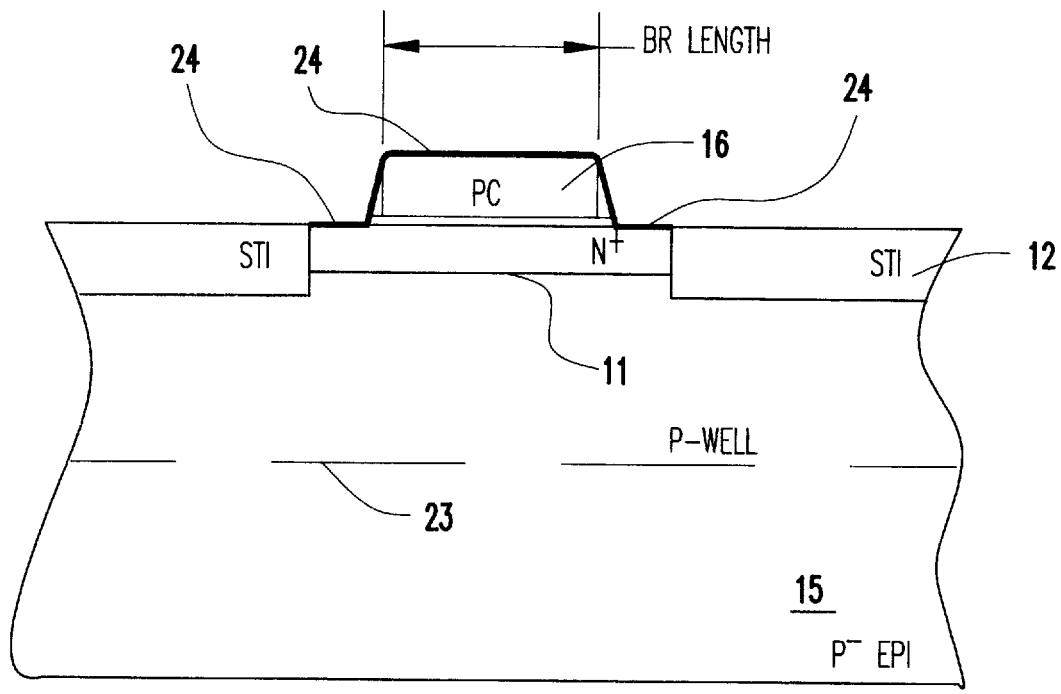
FIG. 6 is a cross-sectional view of the fourth step in the manufacture of a buried resistor.
Figure 7:
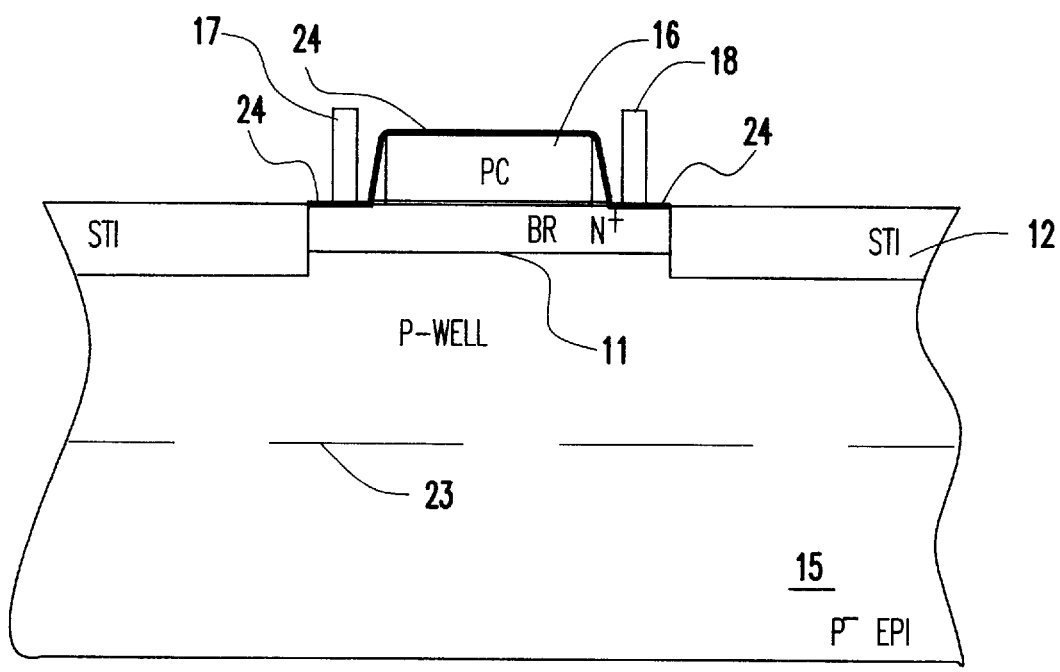
FIG. 7 is a cross-sectional view of the fifth step in the manufacture of a buried resistor.
Figure 8:
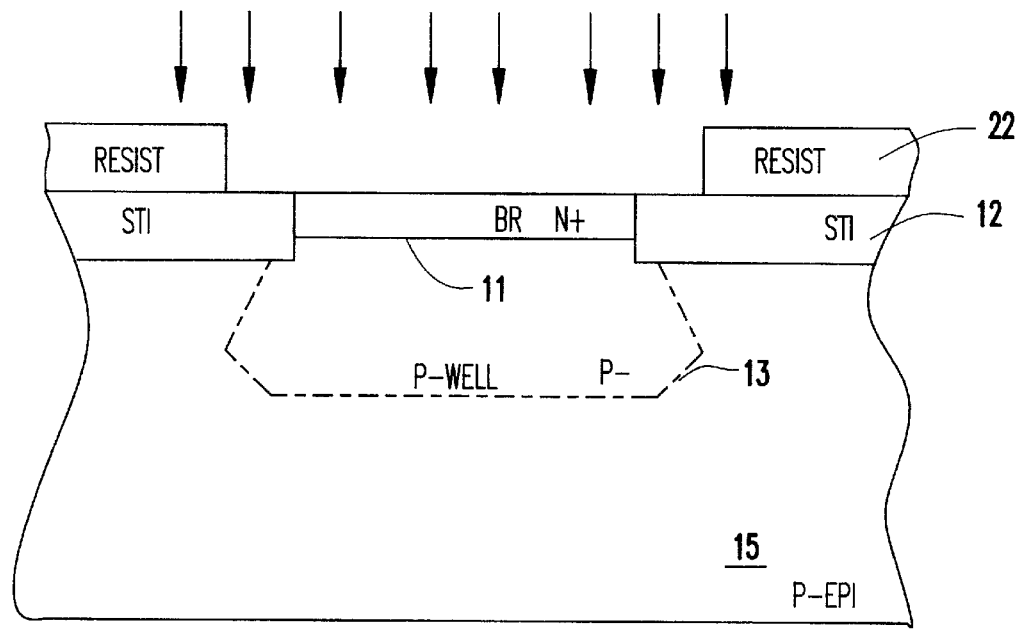
FIG. 8 is a cross-sectional view of the modification of the third step shown in FIG. 5 in the manufacture of the isolated buried resistor according to the invention.
Figure 9:
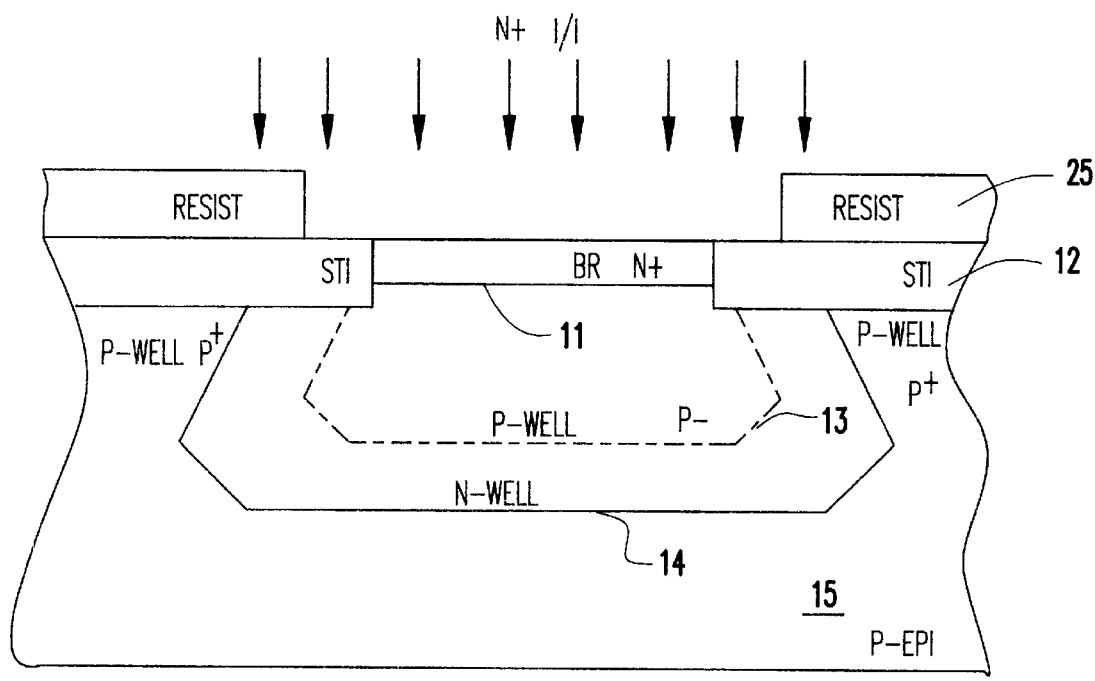
FIG. 9 is a cross-sectional view of an additional step in the manufacture of the isolated buried resistor according to the invention.

In the process according to this invention, the first step shown in FIG. 3 is the same. However, as shown in FIG. 8, the resist 22 added in the second step shown in FIG. 4 is not stripped before making the P-well implant, producing the P-well 13 after the N+ implant 11. The resist can be further patterned (e.g., by etching back the original opening) to produce a larger opening corresponding to the N-well 14. In the alternative, the original resist mask can be stripped and a new resist mask laid down. In either case, as shown in FIG. 9, an N-well is made with an N+ implant using the modified or new mask 25. The remaining steps corresponding to FIGS. 6 and 7 are then performed to produce the structure shown in FIGS. 1 and 2. By adding the N-well 14 as a field shield, the buried resistor is isolated from noise in the substrate (or P-type epitaxial layer 15), thus combining the advantages of buried resistors, such as compatibility to CMOS manufacturing technology and good heat dissipation, with low noise required by some analog circuits.

While the invention has been described in terms of a single preferred embodiment, those skilled in the art will recognize that the invention can be practiced with modification within the spirit and scope of the appended claims. For example, this invention also applies to the case where the substrate is N-type and the buried resistor is P-type. In this case, the P-well disclosed in the preferred embodiment becomes an N-well.

Having thus described our invention, what we claim as new and desire to secure by Letters Patent is as follows:

1. A buried resistor comprising a region of a first conductivity type isolated by shallow trench isolation (STI) and formed within a first well of a second conductivity type, said first well being formed within a second well of said first conductivity type and the second well being formed in an epitaxial layer of the second conductivity type on a substrates, wherein said second well is a field shield isolating the buried resistor from noise in said substrate and said epitaxial layer of the second conductivity type.

2. The buried resistor recited in claim 1 wherein the region isolated by STI is an N+ region and the first conductivity type is an N-type conductivity and the second conductivity type is a P-type conductivity.

3. The buried resistor recited in claim 1 wherein said shallow trench isolation comprises silicon dioxide.

4. The buried resistor recited in claim 1 further comprising a polysilicon layer located on said region of said first conductivity type, first silicide material located on said polysilicon layer, second silicide material located on surface areas of said region of first conductivity type where located on each side of said polysilicon layer, and metal contacts located on said second silicide material.

5. The buried resistor recited in claim 1 wherein said second well is connected to a ground and said first well is left floating.

6. The buried resistor recited in claim 1 wherein said substrate is an N-type conductivity, the first conductivity type is a P-type conductivity, and said second conductivity type is an N-type conductivity.

7. The buried resistor recited in claim 1, wherein at least two of said first well, second well, and said epitaxial layer have a surface which touches said shallow trench isolation.

8. The buried resistor recited in claim 1, wherein said first well, said second well, and said epitaxial layer have surfaces which touch said shallow trench isolation.

9. The buried resistor recited in claim 1, wherein said second well isolates the buried resistor by including first and second surfaces which touch respective surfaces of said shallow isolation trench in such as manner as to cause said second well to surround said first well, said respective surfaces being parallel with and beneath upper surfaces of said shallow trench isolation.

10. The buried resistor recited in claim 9, wherein said first well has surfaces which touch said region and said shallow trench isolation.

11. The buried resistor recited in claim 10, wherein said region touches said shallow trench isolation.

12. The buried resistor recited in claim 1, wherein said second well is not a resistor.

13. A resistor structure, comprising:

a shallow trench isolation layer having an opening;

a region of a first conductivity type disposed within said opening in such a manner as to be isolated by said shallow trench isolation layer, said region forming a resistor;

a first well of a second conductivity type beneath said region;

a second well of the first conductivity type beneath said first well; and an epitaxial layer of the second conductivity type beneath said second well and supported by a substrate, wherein said second well serves as a shield isolating said region from noise present in at least one of said substrate and said epitaxial layer, and wherein at least two of said first well, said second well, and said epitaxial layer have a surface which touches said shallow trench isolation layer.

14. The resistor structure recited in claim 13, wherein said first well, said second well, and said epitaxial layer touch said shallow trench isolation layer.

15. The resistor structure recited in claim 13, wherein said second well isolates said region by including two surfaces which touch respective surfaces of said shallow isolation trench layer in such as manner as to cause said second well to surround said first well, said respective surfaces being parallel with and opposing upper surfaces of said shallow trench isolation layer.

16. The resistor structure recited in claim 15, wherein said respective surfaces of said shallow trench isolation layer are disposed on different sides of said opening.

17. The resistor structure recited in claim 15, wherein said second well surrounds said first well is such a manner as to prevent said epitaxial layer from touching said first well.

18. The resistor structure recited in claim 13, wherein said first well touches said region and said shallow trench isolation layer.

19. The resistor structure recited in claim 13, wherein said region touches said shallow trench isolation layer.

20. The resistor structure recited in claim 19, wherein said region has at least two sides which touch said shallow trench isolation layer.

21. The resistor structure recited in claim 13, wherein said second well is not a resistor.

22. The resistor structure recited in claim 13, wherein said region is a buried resistor.

23. The resistor structure recited in claim 13, wherein said first conductivity type is an N-type conductivity and said second conductivity type is a P-type conductivity.

24. The resistor structure recited in claim 13, wherein said first conductivity type is a P-type conductivity and said second conductivity type is an N-type conductivity.

25. The resistor structure recited in claim 13, wherein said resistor structure is a CMOS device.

26. The resistor structure recited in claim 13, wherein said region, as a result of being isolated from noise by said second well, is compatible for use in a low-noise circuit.

27. The resistor structure recited in claim 26, wherein said low-noise circuit is a analog circuit.

28. The resistor structure recited in claim 13 wherein said second well is connected to a quiet ground.

29. The resistor structure recited in claim 13, wherein said first well is floating within said resistor structure.

30. The resistor structure recited in claim 13, wherein said epitaxial layer contains implanted boron ions.

31. The resistor structure recited in claim 13, further comprising:

a polysilicon layer on said region.

32. The resistor structure recited in claim 31, wherein said polysilicon layer overlaps said opening.

33. The resistor structure recited in claim 13, further comprising:

a pair of contacts on said region.

* * * * *